United States Patent
Midorikawa

(10) Patent No.: US 8,593,874 B2
(45) Date of Patent: Nov. 26, 2013

(54) VOLTAGE GENERATION CIRCUIT WHICH IS CAPABLE OF REDUCING CIRCUIT AREA

(75) Inventor: Tatsuro Midorikawa, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 260 days.

(21) Appl. No.: 13/239,948

(22) Filed: Sep. 22, 2011

(65) Prior Publication Data

US 2012/0106255 A1 May 3, 2012

(30) Foreign Application Priority Data

Nov. 1, 2010 (JP) ................................. 2010-245284

(51) Int. Cl.
- *G11C 11/34* (2006.01)
- *G11C 16/04* (2006.01)
- *G11C 5/14* (2006.01)

(52) U.S. Cl.
USPC ............. 365/185.18; 365/185.17; 365/189.09

(58) Field of Classification Search
USPC ........................................ 365/185.18, 189.09
See application file for complete search history.

(56) References Cited

U.S. PATENT DOCUMENTS

| | | | |
|---|---|---|---|
| 2003/0189859 A1* | 10/2003 | Takahashi et al. | 365/200 |
| 2007/0064495 A1 | 3/2007 | Shibata | |
| 2010/0246305 A1* | 9/2010 | Yang et al. | 365/226 |

FOREIGN PATENT DOCUMENTS

| | | |
|---|---|---|
| JP | 2007-80478 | 3/2007 |
| JP | 2007-87513 | 4/2007 |
| JP | 2010-4717 | 1/2010 |

* cited by examiner

*Primary Examiner* — Ly D Pham
(74) *Attorney, Agent, or Firm* — Oblon, Spivak, McClelland, Maier & Neustadt, L.L.P.

(57) ABSTRACT

According to one embodiment, a voltage generation circuit includes a first boost circuit, a first output circuit, a rectifying circuit, a second output circuit, and a detection circuit. The first boost circuit outputs a first voltage in first and second operation modes. The first output circuit is connected to the first boost circuit, and outputs the first voltage as a second voltage in the first operation mode. The rectifying circuit is connected to the first boost circuit, and outputs a third voltage which is lower than the first voltage in the first operation mode. The second output circuit short-circuits the rectifying circuit in the second operation mode, and outputs the first voltage as a fourth voltage. The detection circuit detects the second and fourth voltages which are supplied from the first and second output circuits.

13 Claims, 8 Drawing Sheets

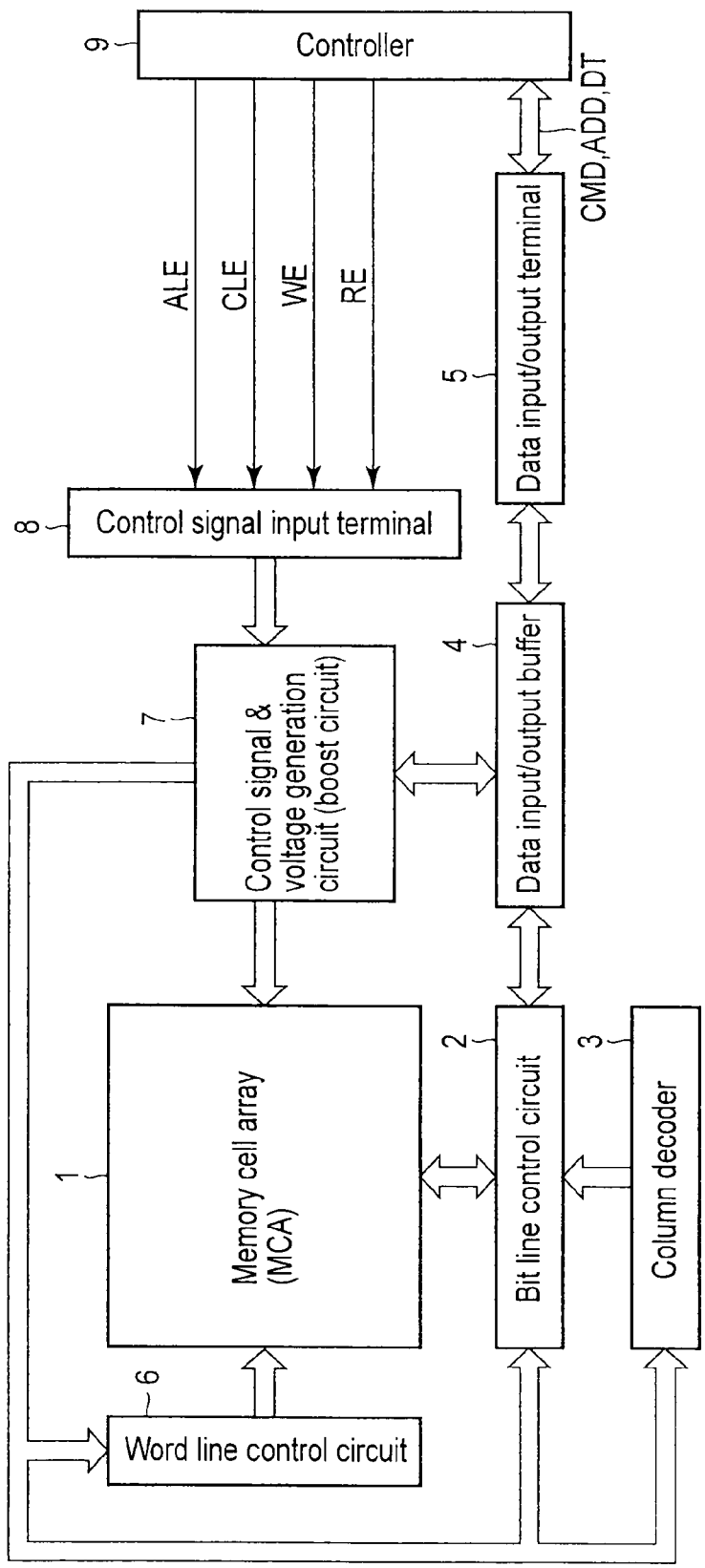
F I G. 1

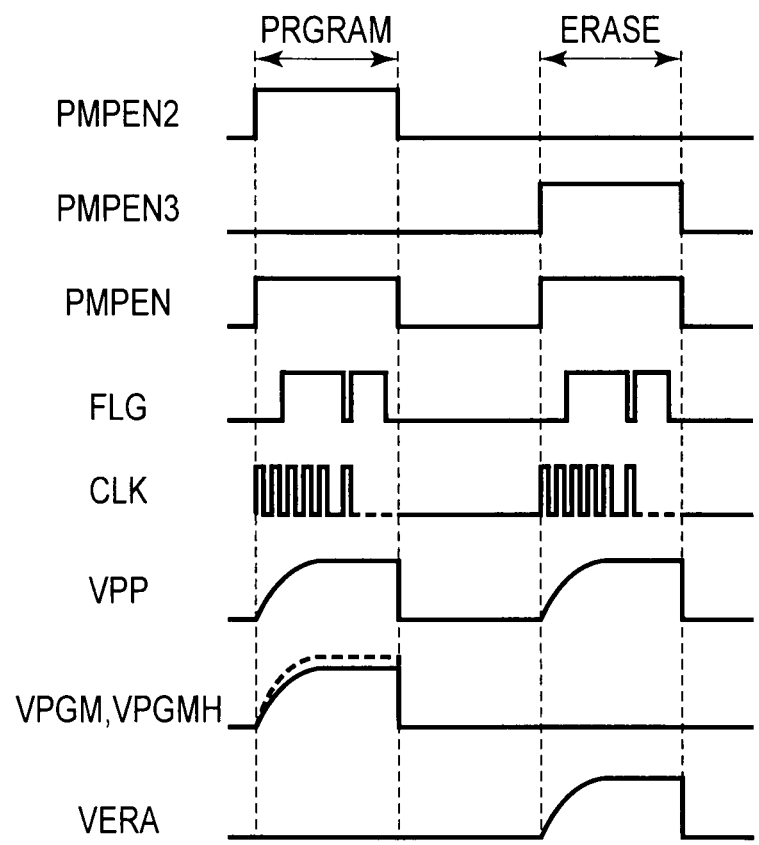
F I G. 3

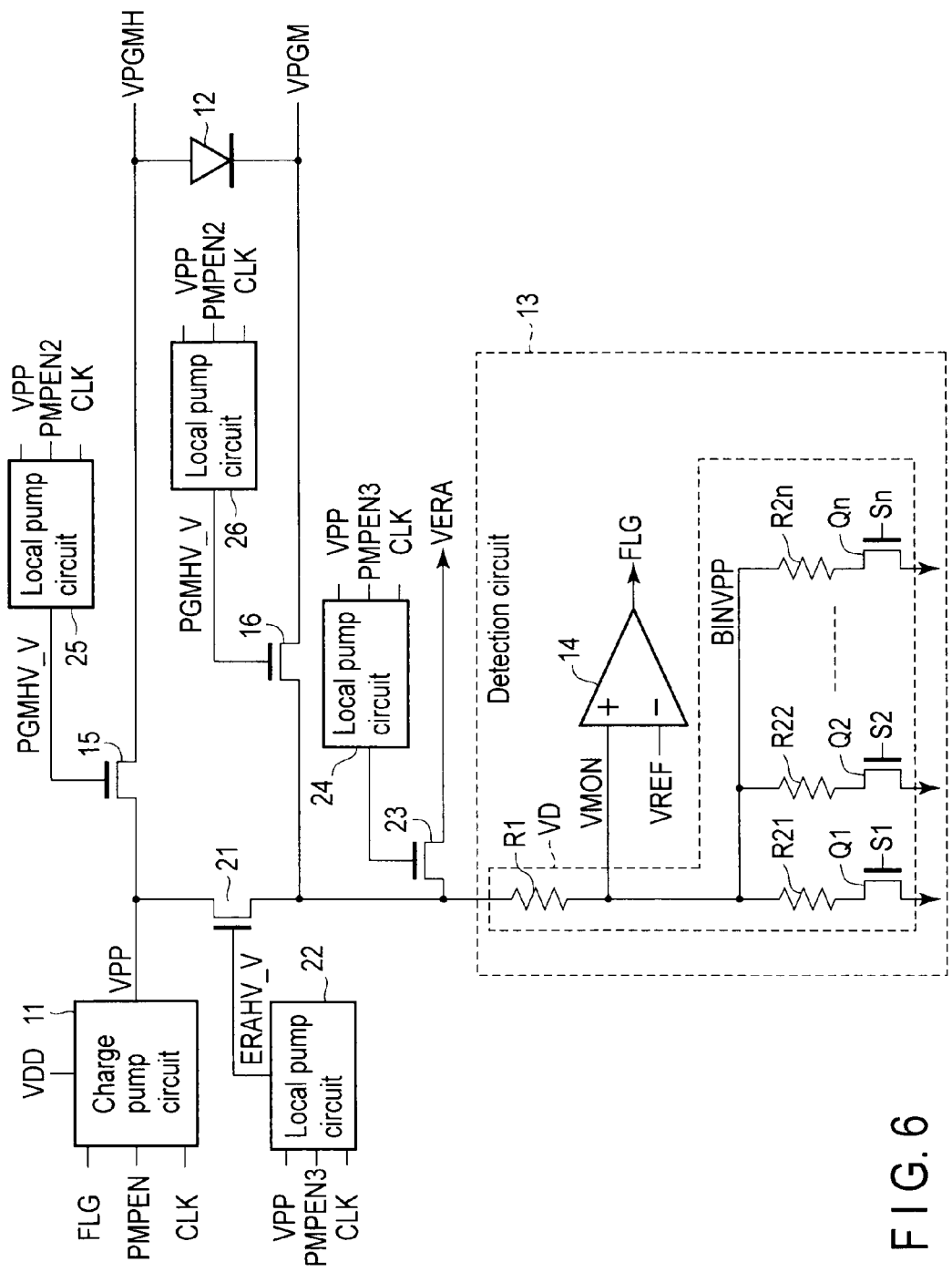
F I G. 6

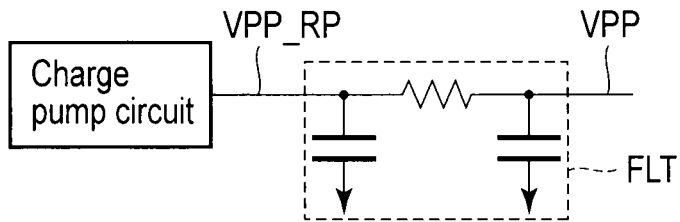
F I G. 7
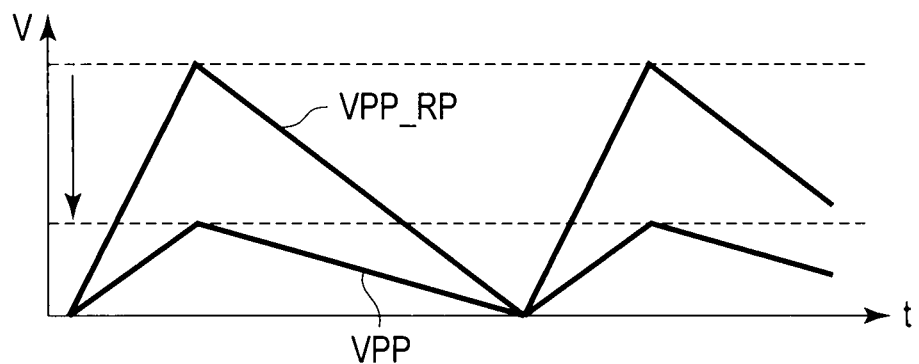
F I G. 8
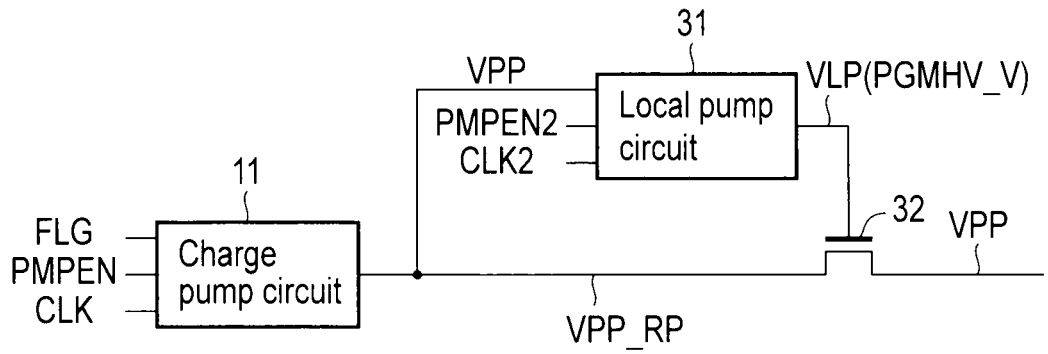
F I G. 9

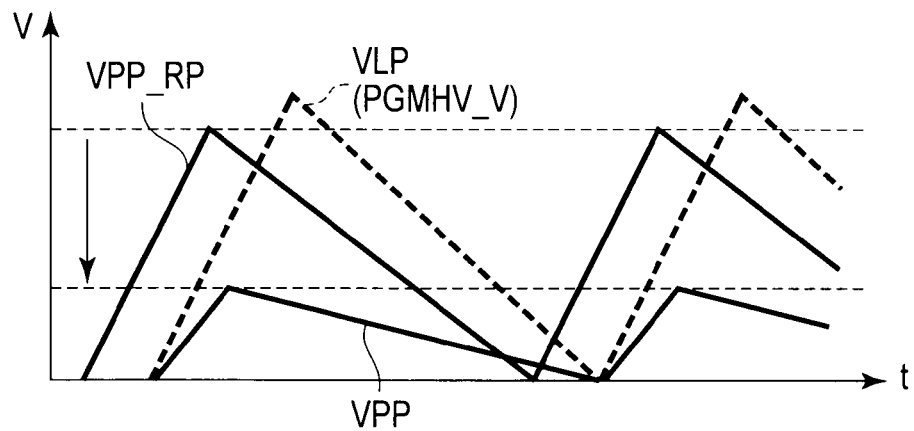
F I G. 10
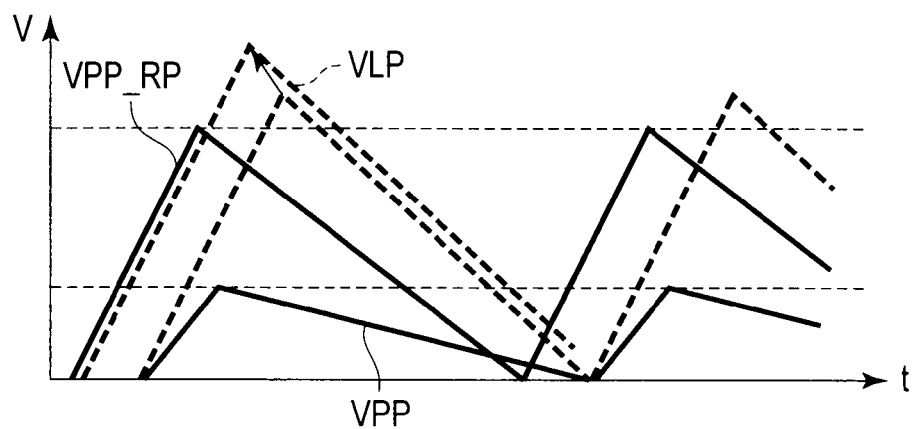
F I G. 11

VOLTAGE GENERATION CIRCUIT WHICH IS CAPABLE OF REDUCING CIRCUIT AREA

CROSS-REFERENCE TO RELATED APPLICATIONS

This application is based upon and claims the benefit of priority from prior Japanese Patent Application No. 2010-245284, filed Nov. 1, 2010, the entire contents of which are incorporated herein by reference.

FIELD

Embodiments described herein relate generally to a voltage generation circuit which is applied to a semiconductor memory device, for example, a NAND flash memory.

BACKGROUND

A NAND flash memory uses high voltages which are higher than an external power supply voltage at times of write and erase. These high voltages are generated by using a charge pump circuit functioning as a boost circuit. A program voltage VPGM, which is generated at the time of write, is supplied to a selected word line. An erase voltage VERA, which is generated at the time of erase, is supplied to a well region in which a memory cell array is formed, and is applied to a back gate of a memory cell.

An output voltage of the charge pump circuit is detected by a detection circuit, and the operation of the charge pump circuit is controlled based on an output signal of the detection circuit.

BRIEF DESCRIPTION OF THE DRAWINGS

FIG. 1 schematically shows the structure of an example of a semiconductor memory device to which embodiments are applied.

FIG. 3 is a timing chart illustrating the operation of the first embodiment.

FIG. 6 is a circuit diagram showing the structure of a voltage generation circuit according to a third embodiment.

FIG. 7 is a circuit diagram showing a comparative example of a charge pump circuit.

FIG. 8 is a waveform diagram illustrating the operation of the charge pump circuit shown in FIG. 7.

FIG. 9 is a circuit diagram showing the structure of the charge pump circuit according to the first to third embodiment.

FIG. 10 is a waveform diagram illustrating the operation of the charge pump circuit shown in FIG. 9.

FIG. 11 is a waveform diagram illustrating another operation of the charge pump circuit shown in FIG. 9.

DETAILED DESCRIPTION

Figure 2:
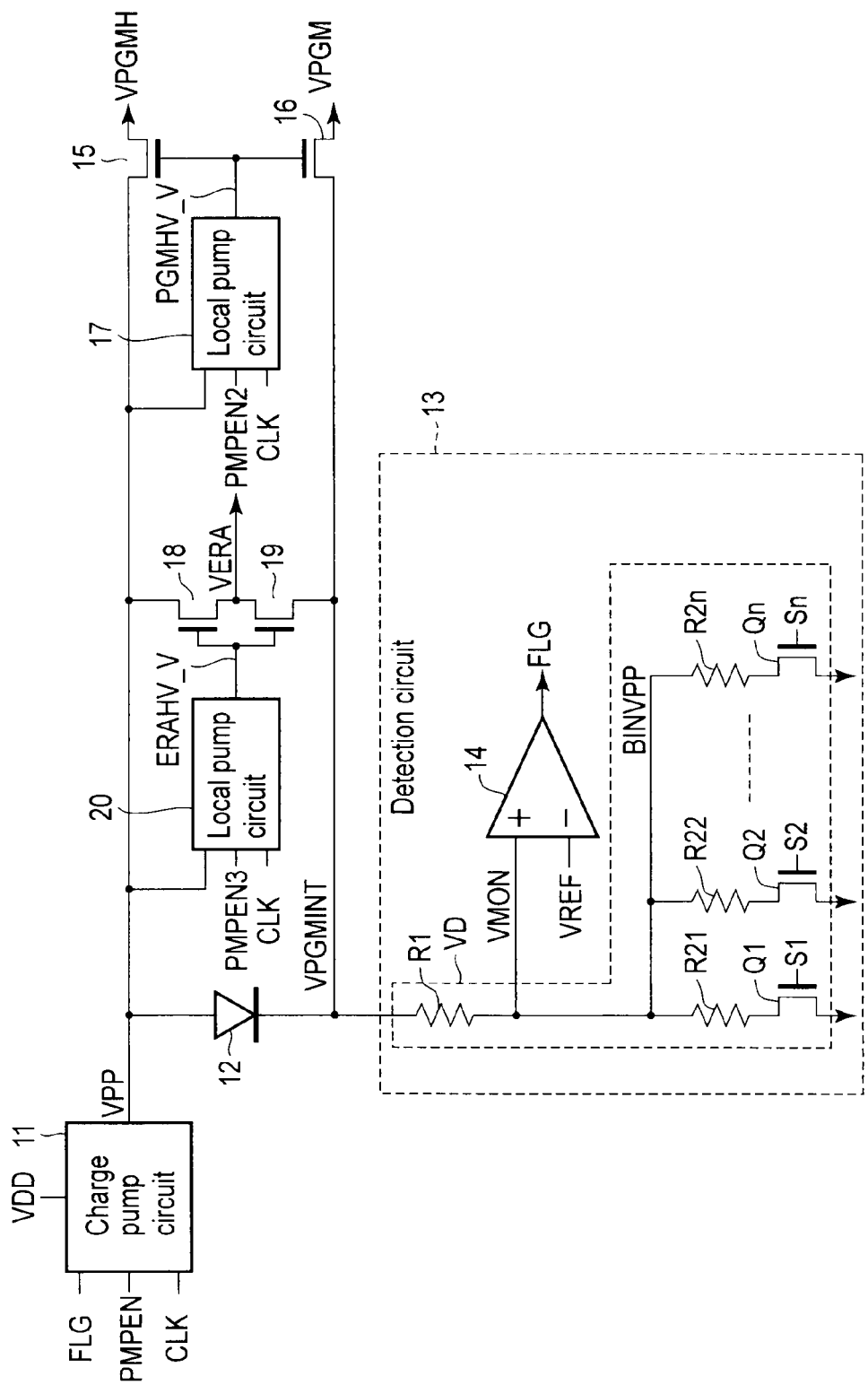
FIG. 2 is a circuit diagram showing the structure of a voltage generation circuit according to a first embodiment.

In general, according to one embodiment, a voltage generation circuit includes a first boost circuit, a first output circuit, a rectifying circuit, a second output circuit, and a detection circuit. The first boost circuit outputs a first voltage in a first operation mode and a second operation mode. The first output circuit is connected to the first boost circuit, and outputs the first voltage as a second voltage in the first operation mode. The rectifying circuit is connected to the first boost circuit, and outputs a third voltage which is lower than the first voltage in the first operation mode. The second output circuit is connected to the first boost circuit, short-circuits the rectifying circuit in the second operation mode, and outputs the first voltage as a fourth voltage. The detection circuit detects the second and fourth voltages which are supplied from the first and second output circuits.

Embodiments will now be described with reference to the accompanying drawings.

FIG. 1 shows the structure of a NAND flash memory functioning as a semiconductor memory device to which the embodiments are applied.

A memory cell array 1 includes a plurality of bit lines, a plurality of word lines, and common source lines. In the memory cell array 1, electrically data rewritable memory cells, which are composed of, e.g. EEPROM cells, are arranged in a matrix. A bit line control circuit 2 for controlling the bit lines and a word line control circuit 6 are connected to the memory cell array 1.

The bit line control circuit 2 executes such operations as reading out data of memory cells in the memory cell array 1 via the bit lines, detecting the states of the memory cells in the memory cell array 1 via the bit lines, and writing data in the memory cells by applying a write control voltage to the memory cells in the memory cell array 1 via the bit lines. A column decoder 3 and a data input/output buffer 4 are connected to the bit line control circuit 2. Data storage circuits in the bit line control circuit 2 are selected by the column decoder 3. The data of the memory cell, which has been read out to the data storage circuit, is output to the outside from a data input/output terminal 5 via the data input/output buffer 4. The data input/output terminal 5 is connected to a controller 9. The controller 9 is composed of, for example, a microcomputer, and receives data which is output from the data input/output terminal 5. In addition, the controller 9 outputs various commands CMD, addresses ADD and data DT, which control the operation of the NAND flash memory. The write data, which has been input from the controller 9 to the data input/output terminal 5, is supplied via the data input/output buffer 4 to the data storage circuit which has been selected by the column decoder 3. The commands and address are supplied to a control signal & voltage generation circuit (hereinafter also referred to as "boost circuit") 7 which generates various control signals and voltages.

The word line control circuit 6 is connected to the memory cell array 1. The word line control circuit 6 selects a word line in the memory cell array 1, and applies a voltage, which is necessary for read, write or erase, to the selected word line.

The memory cell array 1, bit line control circuit 2, column decoder 3, data input/output buffer 4 and word line control circuit 6 are connected to the control signal & voltage generation circuit 7 and are controlled by this control signal & voltage generation circuit 7. The control signal & voltage generation circuit 7 is connected to a control signal input terminal 8 and is controlled by control signals ALE (address latch enable), CLE (command latch enable), WE (write enable) and RE (read enable) which are input from the controller 9 via the control signal input terminal 8. The control signal & voltage generation circuit 7 includes, for example, a charge pump circuit which functions as a boost circuit. The control signal & voltage generation circuit 7 generates, for example, a program voltage and other high voltages, which are supplied to the word lines and bit lines, at the time of data write, and generates, for example, an erase voltage, which is supplied to a well, at the time of data erase.

First Embodiment

FIG. 2 shows an example of the boost circuit 7 according to a first embodiment. The boost circuit 7 includes a charge pump circuit 11. The charge pump circuit 11 is composed of, for example, a series circuit of a plurality of diode-connected transistors (not shown), and a plurality of capacitors which are connected at one end to connection nodes of the diodes and are supplied at the other end with a clock signal. The structure of the charge pump circuit 11 is not limited to this example. The charge pump circuit 11 is supplied with, for example, a power supply voltage VDD, a pump enable signal PMPEN which renders the pump circuit operable, a flag signal FLG which is supplied from a detection circuit (to be described later), and a clock signal CLK. The charge pump circuit 11 boosts the power supply voltage VDD, and generates a voltage VPP which is higher than the power supply voltage VDD. The voltage VPP is output from an output terminal of the charge pump circuit 11.

A detection circuit 13 is connected via a diode 12 between the output terminal of the charge pump circuit 11 and a ground VSS terminal. The detection circuit 13 comprises a voltage division circuit VD and an operational amplifier 14.

The voltage division circuit VD comprises a resistor R1, a plurality of resistors R21, R22, ..., R2n (n is a natural number), and a plurality of transistors Q1, Q2, ..., Qn functioning as switches. One end of the resistor R1 is connected to a cathode of the diode 12. The resistors R21, R22, ..., R2n are connected at one end to the other end of the resistor R1. N-channel MOS transistors (hereinafter also referred to simply as "transistors") Q1, Q2, ..., Qn, for instance, are connected between the other ends of the resistors R21, R22, ..., R2n and a ground. Select signals S1, S2, ..., Sn are supplied to the gate electrodes of the transistors Q1, Q2, ..., Qn. The transistors Q1, Q2, ..., Qn are turned on/off by the select signals S1, S2, ..., Sn, and the resistors R21, R22, ..., R2n are selected and connected to the resistor R1.

The combination between the resistor R1 and the resistors R21, R22, ..., R2n is preset in, for example, a chip test process, and is stored in, for example, a ROM fuse in the memory cell array 1. Based on the combination stored in the ROM fuse, the select signals S1, S2, ..., Sn are generated, and the resistors R21, R22, ..., R2n are selected. Since both the program voltage and erase voltage are, e.g. 20 V, there is no need to change the select signal at the time of generating the program voltage and at the time of the erase voltage. When the program voltage and the erase voltage are different, the select signal may be varied at the time of generating the program voltage and at the time of the erase voltage.

A connection node between the resistor R1 and the resistors R21, R22, ..., R2n is connected to one input terminal of the operational amplifier 14 which functions as a comparator. A reference voltage VREF is supplied to the other input terminal of the operational amplifier 14. The operational amplifier 14 compares the reference voltage VREF and a monitor voltage VMON which is supplied from the voltage division circuit VD. When the monitor voltage VMON exceeds the reference voltage VREF, the operational amplifier 14 outputs a flag signal FLG of, e.g. a high level from an output terminal thereof. The flag signal FLG is supplied to the charge pump circuit 11.

On the other hand, one end of the current path of, e.g. an N-channel MOS transistor 15 is connected to an output terminal of the charge pump circuit 11. In addition, one end of the current path of, e.g. an N-channel MOS transistor 16 is connected to a connection node between the diode 12 and the voltage division circuit VD.

At a time of program, a voltage VPGMINT, which is supplied to the one end of the current path of the transistor 16, is output as a program voltage VPGM from the other end of the current path of the transistor 16. The voltage VPGMINT is a voltage which is lower than the output voltage VPP of the charge pump circuit 11 by a degree corresponding to a forward voltage of the diode 12.

In addition, at the time of program, a voltage VPGMH is output from the other end of the current path of the transistor 15. The voltage VPGMH is a voltage which is higher than the program voltage VPGM by a degree corresponding to the forward voltage of the diode 12, and is equal to the output voltage VPP of the charge pump circuit 11.

An output terminal of a charge pump circuit, which is smaller in size than the charge pump circuit 11, is connected to the gate electrodes of the transistors 15 and 16. This charge pump circuit is referred to as "local pump circuit 17". The local pump circuit 17 is supplied with, for example, a pump enable signal PMPEN2, the clock signal CLK, and the output voltage VPP of the charge pump circuit 11.

At a time of a program operation which is, for example, a first operation mode, the pump enable signal PMPEN2 is set at, e.g. a high level, and thereby the local pump circuit 17 is activated. Based on the clock signal CLK, the local pump circuit 17 boosts the voltage VPP and generates a voltage PGMHV_V. The voltage PGMHV_V is a voltage which is higher than the voltage VPP by a degree corresponding to a threshold voltage Vthn of the N-channel MOS transistor. Thus, the transistor 15, to the gate electrode of which the voltage PGMHV_V is supplied, can output the voltage VPP as the voltage VPGMH, and the transistor 16 can output the voltage VPGMINT as the program voltage VPGM.

In addition, N-channel MOS transistors 18 and 19 are series-connected in parallel between the anode and cathode of the diode 12. An output terminal of a local pump circuit 20 is connected to the gate electrodes of the transistors 18 and 19. The local pump circuit 20 is supplied with, for example, a pump enable signal PMPEN3, the clock signal CLK, and the output voltage VPP of the charge pump circuit 11.

At a time of an erase operation which is, for example, a second operation mode, the pump enable signal PMPEN3 is set at, e.g. a high level, and thereby the local pump circuit 20 is activated. Based on the clock signal CLK, the local pump circuit 20 boosts the voltage VPP and generates a voltage ERAHV_V. The voltage ERAHV_V is a voltage (VPP+Vthn) which is higher than the voltage VPP by a degree corresponding to the threshold voltage Vthn of the N-channel MOS transistor. Thus, a voltage VERA is output from a common connection node between the N-channel MOS transistor 18 and N-channel MOS transistor 19. Specifically, by the transistors 18 and 19 being turned on, both ends of the diode 12 are short-circuited, and the forward voltage of the diode 12 becomes zero.

In the above-described boost circuit, the detection circuit 13 is connected to only the charge pump circuit 11, and neither the local pump circuit 17 for outputting the program voltage nor the local pump circuit 20 for outputting the erase voltage has a detection circuit. Hence, the boost circuit needs to meet the following conditions:

(1) Neither the program voltage VPGM nor the voltage VPGMH must be output at the time of erase.

(2) The erase voltage VERA must not be output at the time of write.

(3) The erase voltage VERA and program voltage VPGM are not short-circuited.

(4) The detection circuit detects the program voltage VPGM at the time of write and detects the erase voltage VERA at the time of erase.

As regards (1), (2) and (3), in the boost circuit of the present embodiment, the pump enable signals PMPEN2 and PMPEN3 execute control to prevent the program voltage VPGM, voltage VPGMH and erase voltage VERA from being generated at the same time. As regards (4), the detection circuit 13 is configured to detect the program voltage VPGM at the time of program and to detect the erase voltage VERA at the time of erase.

Any modification may be made if the boost circuit is configured such that the detection circuit 13 is connected to only the charge pump circuit 11, the boost circuit includes the single detection circuit 13 and a plurality of local pumps, and the boost circuit meets the above-mentioned conditions (1) to (4).

Referring to FIG. 3, the operation of the above-described structure is described. For example, at a time of program, the pump enable signals PMPEN and PMPEN2 are set at the high level, and the charge pump circuit 11 and local pump circuit 17 are activated. At this time point, the flag signal, which is output from the operational amplifier 14, is at the low level, and the charge pump circuit 11 boosts the power supply voltage VDD, based on the clock signal CLK, and generates a VPP. The voltage VPP, which is generated by the charge pump circuit 11, is supplied to the transistor 15 and is also supplied via the diode 12 to the transistor 16 and voltage division circuit VD.

In addition, the local pump circuit 17 boosts the voltage VPP, based on the clock signal CLK, and generates the voltage PGMHV_V. This voltage PGMHV_V is supplied to the gate electrodes of the transistors 15 and 16. Thus, the program voltage VPGM is output from the transistor 16, and the voltage VPGMH is output from the transistor 15. The voltage VPGMH is supplied to the drain of a transfer transistor (not shown) for driving the word line, and the program voltage VPGM is supplied to the current path of the transfer transistor. Accordingly, the program voltage VPGM is supplied to the word line via the transfer transistor.

In addition, the operational amplifier 14 compares the monitor voltage VMON, which is supplied from the voltage division circuit VD, and the reference voltage VREF. If the monitor voltage VMON exceeds the reference voltage VREF, the operational amplifier 14 outputs, from the output terminal thereof, the flag signal FLG which is set at the high level. Accordingly, the boost operation of the charge pump circuit 11 is stopped. Thereafter, if the monitor voltage VMON lowers to the reference voltage VREF or less, the charge pump circuit 11 resumes the boost operation. This operation is repeated, and the output voltage VPP is maintained.

The charge pump circuit 11 and local pump circuit 17 stop the boost operation if the program operation is completed and the pump enable signals PMPEN and PMPEN2 are set at the low level. Accordingly, the transistors 15 and 16, to which the output voltage of the local pump circuit 17 is supplied, are turned off.

Next, at the time of an erase operation, if the pump enable signal PMPEN and PMPEN 3 are set at the high level, the charge pump circuit 11 and local pump circuit 20 are activated. At this time point, the flag signal, which is output from the operational amplifier 14, is at the low level, and the charge pump circuit 11 boosts the power supply voltage VDD, based on the clock signal CLK, and generates a VPP. The voltage VPP, which is generated by the charge pump circuit 11, is supplied to the transistor 15 and is also supplied via the diode 12 to the transistor 16 and voltage division circuit VD. Thus, the detection circuit 13 detects the erase voltage VERA at the time of the erase operation.

In addition, the local pump circuit 20 boosts the voltage VPP, based on the clock signal CLK, and generates the voltage ERAHV_V. This voltage ERAHV_V is supplied to the gate electrodes of the transistors 18 and 19. Thus, the transistors 18 and 19 are turned on, and the anode and cathode of the diode 12 are set in a short-circuited state. Accordingly, the erase voltage VERA, which is equal in level to the voltage VPP, is output from the connection node between the transistors 18 and 19. This erase voltage VERA is supplied to the well (not shown) in which the memory cell array is formed, and is supplied to the back gate electrode of the memory cell.

The charge pump circuit 11 and local pump circuit 20 stop the boost operation if the erase operation is completed and the pump enable signals PMPEN and PMPEN3 are set at the low level. Accordingly, the transistors 18 and 19, to which the output voltage of the local pump circuit 20 is supplied, are turned off.

According to the first embodiment, the transistor 15 is connected to the output terminal of the charge pump circuit 11 via the diode 12, and also the transistor 16 is connected to the output terminal of the charge pump circuit 11. These transistors 15 and 16 are driven by the output voltage of the local pump circuit 17 which is activated by the pump enable signal PMPEN2 at the time of program. Thus, at the time of program, the program voltage VPGM can be output via the transistor 16, and the voltage VPGMH can be output via the transistor 15.

In addition, the series circuit of the transistors 18 and 19 is connected in parallel to the diode 12. These transistors 18 and 19 are driven by the output voltage of the local pump circuit 20 which is activated by the pump enable signal PMPEN3 at the time of erase. Thus, at the time of erase, the erase voltage VERA can be output from the connection node between the transistors 18 and 19.

Furthermore, the detection circuit 13 detects the program voltage VPGM at the time of program, and the detection circuit 13 detects the erase voltage VERA at the time of erase. Since the single detection circuit 13 is used at the time of the program operation and at the time of the erase operation, there is no need to provide a plurality of such detection circuits 13. Therefore, the layout area of the boost circuit can be reduced.

Figure 4:
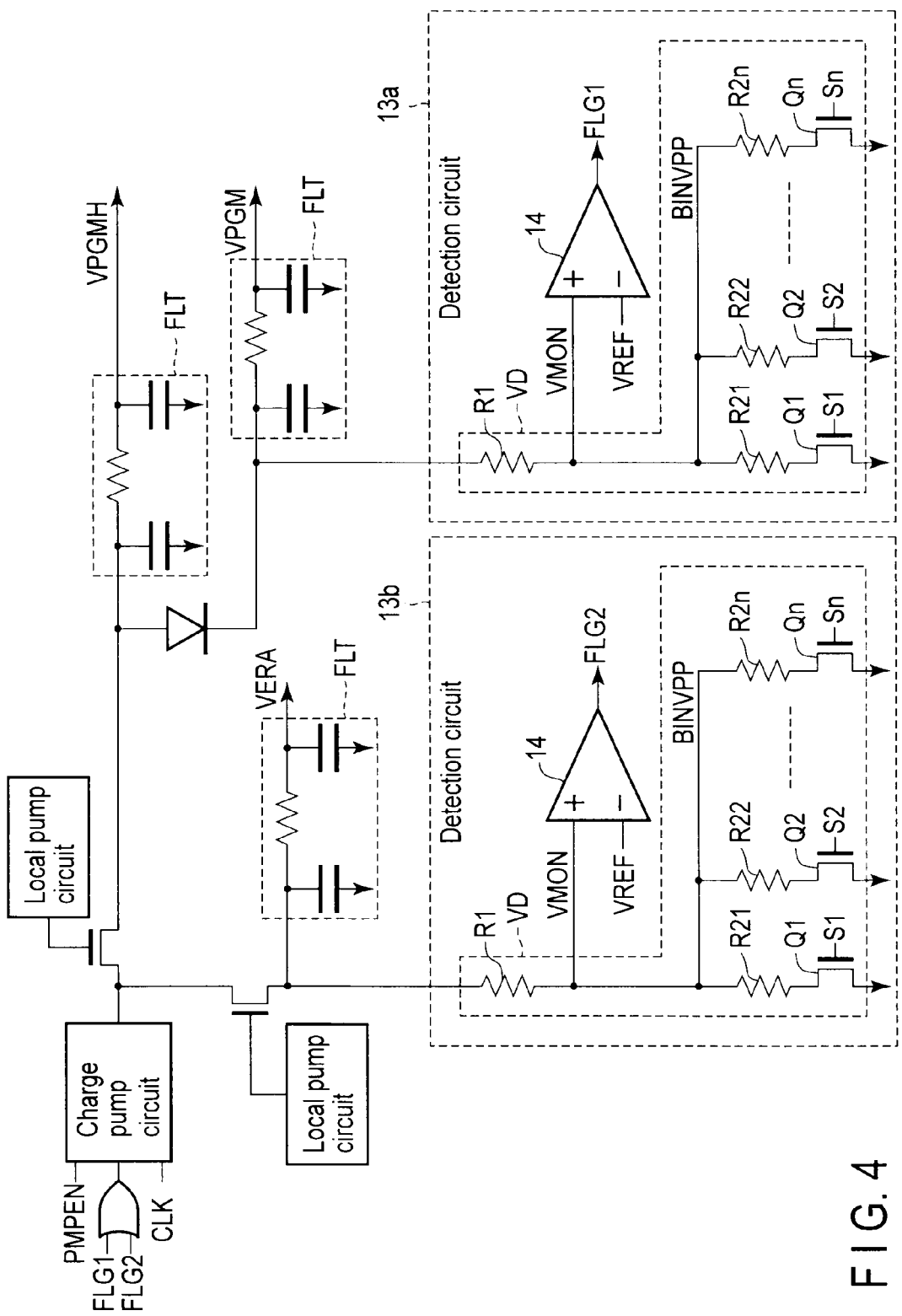
FIG. 4 is a circuit diagram showing a comparative example relating to the first embodiment.

FIG. 4 shows a comparative example of the first embodiment. A boost circuit shown in the comparative example includes a detection circuit 13a for detecting a program voltage VPGM and a detection circuit 13b for detecting an erase voltage VERA. The detection circuits 13a and 13b include voltage division circuits VDa and VDb, respectively. Each of the voltage division circuits VDa and VDb includes a plurality of resistors R1, R21, R22, . . . , R2n, and transistors Q1, Q2, . . . , Qn. Of these components, the resistors R1, R21, R22, . . . , R2n require a large layout area. Hence, if the number of detection circuits increases, the layout area of the boost circuit increases.

However, as in the first embodiment, by using the detection circuit for both the detection of the program voltage and the detection of the erase voltage, the layout area can remarkably be reduced, compared to the comparative example.

Second Embodiment

Figure 5:
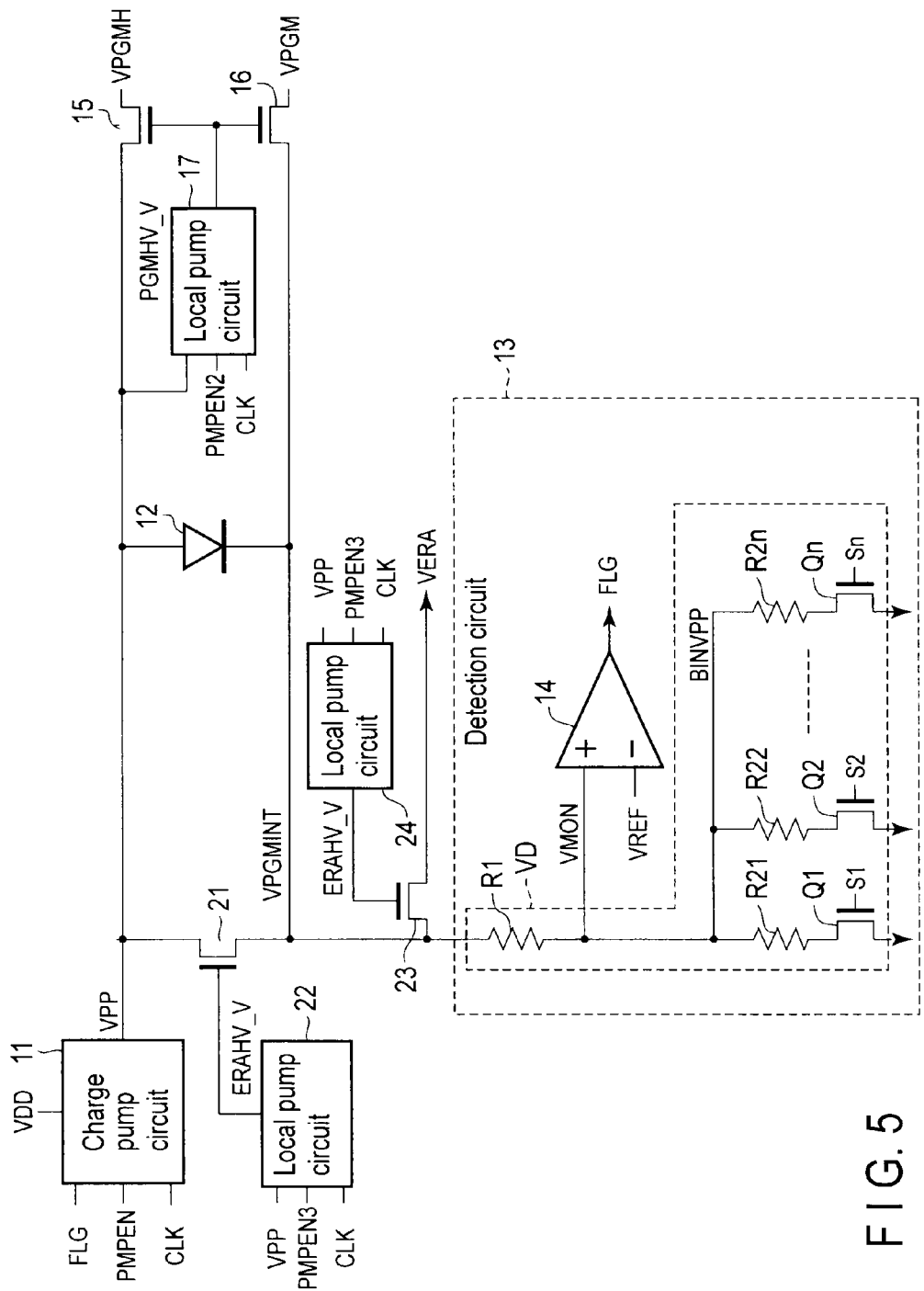
FIG. 5 is a circuit diagram showing the structure of a voltage generation circuit according to a second embodiment.

FIG. 5 shows a second embodiment. In FIG. 5, the same parts as in FIG. 2 are denoted by like reference numerals, and only different parts are described.

In the first embodiment, the transistors 18 and 19, which are connected in parallel to the diode 12, are controlled by the output voltage of the single local pump circuit 20, and the erase voltage VERA is output from the connection node between the transistors 18 and 19.

By contrast, in the second embodiment, the erase voltage VERA is generated by using transistors 21 and 23 and two local pump circuits 22 and 24. One end of the current path of the transistor 21 is connected to the output terminal of the charge pump circuit 11, and the other end thereof is connected to one end of the resistor R1 which constitutes the voltage division circuit VD. Specifically, the transistor 21 is connected in parallel to the diode 12. A voltage ERAHV_V, which is output from the local pump circuit 22, is supplied to the gate electrode of the transistor 21. The ERAHV_V is VPP+Vthn, as described above. Thus, the transistor 21 transfers the output voltage VPP of the charge pump circuit 11 as such.

In addition, one end of the current path of the transistor 23 is connected to a connection node between the transistor 21 and the resistor R1. A voltage ERAHV_V, which is output from the local pump circuit 24, is supplied to the gate electrode of the transistor 23. Based on the ERAHV_V, the transistor 23 transfers the voltage VPP as such, which has been transferred from the transistor 21, and outputs an erase voltage VERA (=VPP) from the other end of the current path of the transistor 23.

The local pump circuits 22 and 24 are activated by a pump enable signal PMPEN3. Thus, the local pump circuits 22 and 24 do not execute the boost operation when the local pump circuit 17, which is activated by the pump enable signal PMPEN2, is in operation, and the local pump circuits 22 and 24 execute the boost operation when the local pump circuit 17 is not activated.

In addition, the detection circuit 13 detects the program voltage VPGM when the boost circuit is generating the program voltage VPGM, and the detection circuit 13 detects the erase voltage VERA when the boost circuit is generating the erase voltage VERA.

According to the second embodiment, too, the above-described conditions of the boost circuit can be satisfied, and the same advantageous effects as in the first embodiment can be obtained.

In the second embodiment, compared to the first embodiment, the number of local pump circuits increases by one. However, the local pump circuit is composed of a circuit which is smaller in scale than the plural resistors included in the detection circuit. Thus, the increase in circuit scale is small.

Third Embodiment

FIG. 6 shows a third embodiment. The same parts as in FIG. 5 are denoted by like reference numerals, and only different parts are described.

In the second embodiment, the circuit, which generates the program voltages VPGM and VPGMH, is the same as in the first embodiment. By contrast, in the third embodiment, two local pump circuits are used in order to generate the program voltages VPGM and VPGMH.

Specifically, one end of the current path of a transistor 15 is connected to the output terminal of the charge pump circuit 11. The other end of the current path of the transistor 15 is connected to one end of the current path of a transistor 16 via a diode 12. The other end of the current path of the transistor 16 is connected to a connection node between the transistor 21 and the voltage division circuit VD. A voltage PGMHV_V (=VPP+Vthn), which is output from a local pump circuit 25, is supplied to the gate electrode of the transistor 15. A voltage PGMHV_V (=VPP+Vthn), which is output from a local pump circuit 26, is supplied to the gate electrode of the transistor 16.

The local pump circuits 25 and 26 are activated by the pump enable signal PMPEN2, thereby boosting the voltage VPP that is output from the charge pump circuit 11 and generating the PGMHV_V.

In the above structure, at the time of a program operation, the pump enable signal PMPEN3 is set at the low level, and the local pump circuits 22 and 24 are inactivated. Thus, the transistors 21 and 23 are set in the OFF state.

At this time, the pump enable signals PMPEN and PMPEN2 are set at the high level, and the charge pump circuit 11 and local pump circuits 25 and 26 are activated. Thus, the transistor 15 is turned on by the output voltage PGMHV_V of the local pump circuit 25, and transfers the output voltage VPP of the charge pump circuit 11 as such. Accordingly, the voltage VPGMH (=VPP) is output from the connection node of the anode of the diode 12.

In addition, the program voltage VPGM (VPGMH−Vthn) is output from the cathode of the diode 12.

Furthermore, the transistor 16 is turned on by the output voltage PGMHV_V of the local pump circuit 26, and transfers the program voltage VPGM, which is output from the cathode of the diode 12, to the voltage division circuit VD. Thus, at the time of program, the detection circuit 13 detects the level of the program voltage VPGM, and controls the operation of the charge pump circuit 11, based on the flag signal FLG which is the detection output signal.

On the other hand, at the time of erase, the pump enable signal PMPEN2 is set at the low level, and the local pump circuits 25 and 26 are inactivated. Thus, the transistors 15 and 16 are set in the OFF state.

At this time, the pump enable signal PMPEN3 is set at the high level, and the local pump circuits 22 and 24 are operated. Thus, the transistors 21 and 23 are turned on, and the erase voltage VERA is generated by the above-described operation.

According to the third embodiment, too, the above-described conditions of the boost circuit can be satisfied, and the same advantageous effects as in the first embodiment can be obtained.

In the third embodiment, compared to the second embodiment, the number of local pump circuits increases by one. However, the local pump circuit is composed of a circuit which is smaller in scale than the plural resistors included in the detection circuit. Thus, the increase in circuit scale is small.

Besides, the number of local pump circuits can be increased, where necessary.

Fourth Embodiment

In general, at the start of boost, a ripple component occurs in the output voltage of the charge pump circuit. In order to suppress the ripple component, consideration is now given to the provision of a filter FLT at the output terminal of the charge pump circuit 11, the filter FLT being composed of a resistor and capacitors, as shown in FIG. 4 and FIG. 7. By providing the filter FLT, a voltage VPP, in which the ripple component is suppressed, can be generated from an output voltage VPP_RP including the ripple component of the charge pump circuit 11, as shown in FIG. 8.

However, the capacitance of the capacitors, which constitute the filter FLT, is a parasitic capacitance to the capacitor provided in the charge pump circuit 11. This is a possible factor which deteriorates the capability of the charge pump circuit 11, for example, the boost speed of the charge pump circuit 11, or which increases the electric current consumption of the charge pump circuit 11.

Taking this into account, as shown in FIG. 9 and in the first to third embodiments, a local pump circuit 31, in place of the filter, is connected to the output terminal of the charge pump circuit 11, and the output voltage of the local pump circuit 31 controls the gate electrode of a transistor 32 which is connected to the output terminal of the charge pump circuit 11. The output voltage of the local pump circuit 31 controls a phase difference between an output voltage VLP of the local pump circuit 31 and an output voltage VPP_RP of the charge pump circuit 11.

Referring to FIG. 10, a concrete description is given. FIG. 10 is an enlarged view of, for example, the phase difference between the output voltage VLP (PGMHV_V) of the local pump circuit 31 and the output voltage VPP_RP of the charge pump circuit 11. By controlling the gate electrode of the transistor 32 by the output voltage VLP of the local pump circuit 31, the output voltage VPP_RP of the charge pump circuit 11 is clamped. Thus, the voltage VPP, from which the ripple component has been eliminated, can be output from the transistor 32.

In the case where the phase difference between the output voltage VLP of the local pump circuit 31 and the output voltage VPP_RP of the charge pump circuit 11 is increased, the boost capability of the local pump circuit 31 can be lowered. In a concrete method, for example, the frequency of a clock CLK2, which is supplied to the local pump circuit 31, is made lower than the frequency of the clock signal CLK of the charge pump circuit 11. Alternatively, the amplitude of the clock signal CLK2 is made smaller than the amplitude of the clock signal CLK of the charge pump circuit 11. Alternatively, the size of the capacitor for boost, which constitutes the charge pump circuit 31, is made smaller than the size of the capacitor for boost, which constitutes the charge pump circuit 11. Besides, these methods may be combined to implement this scheme.

In this manner, by decreasing the boost capability of the local pump circuit 31, it is possible to increase the phase difference between the output voltage VLP of the local pump circuit 31, which is supplied to the gate electrode of the transistor, and the output voltage VPP_RP of the charge pump circuit 11. Accordingly, it is possible to decrease the potential difference (overdrive voltage) between the output voltage VLP of the local pump circuit 31 and the output voltage VPP_RP of the charge pump circuit 11. Therefore, when the potential difference between the output voltage VLP of the local pump circuit 31 and the output voltage VPP_RP of the charge pump circuit 11 is large, the ripple component included in the output voltage VPP of the transistor 32 can be reduced by increasing the phase difference between these output voltages.

On the other hand, in the case where the phase difference between the output voltage VLP of the local pump circuit 31 and the output voltage VPP_RP of the charge pump circuit 11 is decreased, the boost capability of the local pump circuit 31 can be enhanced. In a concrete method, for example, the frequency of the clock CLK2, which is supplied to the local pump circuit 31, is made higher than the frequency of the clock signal CLK of the charge pump circuit 11. Alternatively, the amplitude of the clock signal CLK2 is made larger than the amplitude of the clock signal CLK of the charge pump circuit 11. Alternatively, the size of the capacitor for boost, which constitutes the charge pump circuit 31, is larger than the size of the capacitor for boost, which constitutes the charge pump circuit 11. Besides, these methods may be combined to implement this scheme.

As shown in FIG. 11, by enhancing the boost capability of the local pump circuit 31, it is possible to decrease the phase difference between the voltage VLP, which is supplied to the gate electrode of the transistor 32, and the output voltage VPP_RP of the charge pump circuit 11. Accordingly, it is possible to increase the potential difference (overdrive voltage) between the output voltage VLP of the local pump circuit 31 and the output voltage VPP_RP of the charge pump circuit 11. Therefore, by executing this control when the output voltage of the charge pump circuit 11 is low and the ripple component is small, the ON resistance of the transistor 32 can be decreased and the raising of the output voltage VPP of the transistor 32 can be made faster.

According to the fourth embodiment, the local pump circuit 31 is connected to the output terminal of the charge pump circuit 11. The gate electrode of the transistor 32, which is connected to the output terminal of the charge pump circuit 11, is controlled by the output voltage VLP of the local pump circuit 31, and the phase difference between the output voltage VLP of the local pump circuit 31 and the output voltage of the charge pump circuit 11 is controlled. Therefore, as in the case in which the filter is provided at the output terminal of the charge pump circuit 11, the ripple component included in the output voltage VPP_RP of the charge pump circuit 11 can be eliminated.

In addition, by dispensing with the filter at the output terminal of the charge pump circuit 11, a decrease in boost speed of the charge pump circuit 11 can be prevented, and an increase in electric current consumption can be suppressed.

The embodiments include following aspects:

A. A voltage generation circuit of a semiconductor memory device, comprising:

a first boost circuit configured to output a first voltage in a first operation mode and in a second operation mode;

a first output circuit electrically connected to the first boost circuit, the first output circuit being configured to output the first voltage as a second voltage in the first operation mode;

a rectifying circuit electrically connected to the first boost circuit, the rectifying circuit being configured to output a third voltage which is lower than the first voltage in the first operation mode;

a second output circuit electrically connected to the first boost circuit, the second output circuit being configured to short-circuit the rectifying circuit in the second operation mode and to output the first voltage as a fourth voltage; and a detection circuit configured to detect the second and fourth voltages, wherein the second output circuit comprises:

a second boost circuit configured to output a fifth voltage which is higher than the first voltage at the time of the second operation mode;

a first transistor with a current path having one end connected to the first boost circuit, the first transistor being configured to short-circuit the rectifying circuit, based on the fifth voltage;

a third boost circuit configured to output a sixth voltage which higher than the first voltage in the second operation mode; and a second transistor with a current path having one end connected to the other end of the current path of the first transistor, the second transistor being configured to output the fourth voltage, based on the sixth voltage.

B. A voltage generation circuit of a semiconductor memory device, comprising:

a first boost circuit configured to output a first voltage in a first operation mode and in a second operation mode;

a first output circuit electrically connected to the first boost circuit, the first output circuit being configured to output the first voltage as a second voltage in the first operation mode;

a rectifying circuit electrically connected to the first boost circuit, the rectifying circuit being configured to output a third voltage which is lower than the first voltage in the first operation mode;

a second output circuit electrically connected to the first boost circuit, the second output circuit being configured to short-circuit the rectifying circuit in the second operation mode and to output the first voltage as a fourth voltage; and a detection circuit configured to detect the second and fourth voltages, wherein the second output circuit comprises:

a second boost circuit configured to output a fifth voltage which is higher than the first voltage at the time of the second operation mode;

a first transistor with a current path having one end connected to the first boost circuit, the first transistor being configured to short-circuit the rectifying circuit, based on the fifth voltage;

a third boost circuit configured to output a sixth voltage which higher than the first voltage in the second operation mode; and a second transistor with a current path having one end connected to the other end of the current path of the first transistor, the second transistor being configured to output the fourth voltage, based on the sixth voltage, wherein the first output circuit comprises:

a fourth boost circuit configured to output a seventh voltage higher than the first voltage in the first operation mode;

a third transistor with a current path connected between the first boost circuit and one end of the rectifying circuit, the third transistor being configured to output the first voltage as the second voltage based on the seventh voltage;

a fifth boost circuit configured to output an eighth voltage higher than the first voltage in the first operation mode; and a fourth transistor with a current path connected between the other end of the rectifying circuit and the other end of the current path of the first transistor, the fourth transistor being configured to be driven by the eighth voltage.

C. The circuit according to claim B, further comprising a filter circuit connected to the first boost circuit.

D. The circuit according to claim B, Wherein the filter circuit comprises:

a resister includes first and second ends, the first end is connected to the first boost circuit;

a first capacitor connected between the first end of the resister and a first potential; and a second capacitor connected between the second end of the resister and the first potential.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A voltage generation circuit comprising:

a first boost circuit configured to output a first voltage in a first operation mode and in a second operation mode;

a first output circuit connected to the first boost circuit, the first output circuit being configured to output the first voltage as a second voltage in the first operation mode;

a rectifying circuit connected to the first boost circuit, the rectifying circuit being configured to output a third voltage which is lower than the first voltage in the first operation mode;

a second output circuit connected to the first boost circuit, the second output circuit being configured to short-circuit the rectifying circuit at a time of the second operation mode and to output the first voltage as a fourth voltage; and a detection circuit configured to detect the second and fourth voltages which are supplied from the first and second output circuits, the first output circuit comprising:

a second boost circuit electrically connected to the first boost circuit, the second boost circuit being configured to output a fifth voltage which is higher than the first voltage in the first operation mode;

a first transistor configured to output the first voltage as the second voltage, based on the fifth voltage; and a second transistor configured to output the third voltage, based on the fifth voltage, and the second output circuit comprising:

a third boost circuit electrically connected to the first boost circuit, the third boost circuit being configured to output a sixth voltage which is higher than the first voltage in the second operation mode; and third and fourth transistors series-connected between both ends of the rectifying circuit, the third and fourth transistors being configured to output the fourth voltage, based on the sixth voltage.

2. The circuit according to claim 1, wherein a phase of the fifth voltage, which is output from the second boost circuit, or a phase of the sixth voltage, which is output from the third boost circuit, is shifted from a phase of the first voltage which is output from the first boost circuit.

3. The circuit according to claim 1, wherein the first transistor is connected to the first boost circuit and a gate of the first transistor is connected to an output node of the second boost circuit, and the second transistor is connected to the rectifying circuit and a gate of the second transistor is connected to the output node of the second boost circuit.

4. The circuit according to claim 1, wherein gates of the third and fourth transistors are connected to an output node of the third boost circuit.

5. A voltage generation circuit comprising:

a first boost circuit configured to output a first voltage in a first operation mode and in a second operation mode;

a first output circuit connected to the first boost circuit, the first output circuit being configured to output the first voltage as a second voltage in the first operation mode;

a rectifying circuit connected to the first boost circuit, the rectifying circuit being configured to output a third voltage which is lower than the first voltage in the first operation mode;

a second output circuit connected to the first boost circuit, the second output circuit being configured to short-circuit the rectifying circuit in the second operation mode and to output the first voltage as a fourth voltage; and a detection circuit configured to detect the second and fourth voltages.

6. The circuit according to claim 5, wherein the second output circuit comprises:
- a second boost circuit configured to output a fifth voltage which is higher than the first voltage at the time of the second operation mode;
- a first transistor with a current path having one end connected to the first boost circuit, the first transistor being configured to short-circuit the rectifying circuit, based on the fifth voltage;
- a third boost circuit configured to output a sixth voltage which higher than the first voltage in the second operation mode; and
- a second transistor with a current path having one end connected to the other end of the current path of the first transistor, the second transistor being configured to output the fourth voltage, based on the sixth voltage.

7. The circuit according to claim 6, wherein the first output circuit comprises:
- a fourth boost circuit configured to output a seventh voltage higher than the first voltage in the first operation mode;
- a third transistor with a current path connected between the first boost circuit and one end of the rectifying circuit, the third transistor being configured to output the first voltage as the second voltage based on the seventh voltage;
- a fifth boost circuit configured to output an eighth voltage higher than the first voltage in the first operation mode; and
- a fourth transistor with a current path connected between the other end of the rectifying circuit and the other end of the current path of the first transistor, the fourth transistor being configured to be driven by the eighth voltage.

8. The circuit according to claim 7, wherein a phase of the fifth voltage or a phase of the sixth voltage is shifted from a phase of the first voltage.

9. A semiconductor memory device comprising:
- a voltage generation circuit, the voltage generation circuit comprising:
  - a first boost circuit configured to output a first voltage in a first operation mode and in a second operation mode;
  - a first output circuit electrically connected to the first boost circuit, the first output circuit being configured to output the first voltage as a second voltage in the first operation mode;
  - a rectifying circuit electrically connected to the first boost circuit, the rectifying circuit being configured to output a third voltage which is lower than the first voltage in the first operation mode;
  - a second output circuit electrically connected to the first boost circuit, the second output circuit being configured to short-circuit the rectifying circuit in the second operation mode and to output the first voltage as a fourth voltage; and
  - a detection circuit configured to detect the second and fourth voltages.

10. The semiconductor memory device according to claim 9, wherein the second output circuit comprises:
- a second boost circuit configured to output a fifth voltage which is higher than the first voltage at the time of the second operation mode;
- a first transistor with a current path having one end connected to the first boost circuit, the first transistor being configured to short-circuit the rectifying circuit, based on the fifth voltage;
- a third boost circuit configured to output a sixth voltage which higher than the first voltage in the second operation mode; and
- a second transistor with a current path having one end connected to the other end of the current path of the first transistor, the second transistor being configured to output the fourth voltage, based on the sixth voltage.

11. The semiconductor memory device according to claim 10, wherein the first output circuit comprises:
- a fourth boost circuit configured to output a seventh voltage higher than the first voltage in the first operation mode;
- a third transistor with a current path connected between the first boost circuit and one end of the rectifying circuit, the third transistor being configured to output the first voltage as the second voltage based on the seventh voltage;
- a fifth boost circuit configured to output an eighth voltage higher than the first voltage in the first operation mode; and
- a fourth transistor with a current path connected between the other end of the rectifying circuit and the other end of the current path of the first transistor, the fourth transistor being configured to be driven by the eighth voltage.

12. The semiconductor memory device according to claim 11, wherein a phase of the fifth voltage or a phase of the sixth voltage is shifted from a phase of the first voltage.

13. The semiconductor memory device according to claim 11, wherein the first operation mode constitutes a program operation of the semiconductor memory device, and the second operation mode constitutes an erase operation of the semiconductor memory device.

* * * * *